United States Patent [19]

Townley

[11] Patent Number: 4,970,478

[45] Date of Patent: Nov. 13, 1990

[54] MATCHED MICROWAVE VARIABLE ATTENUATOR

[75] Inventor: Scott A. Townley, Phoenix, Ariz.

[73] Assignee: Honeywell, Inc., Minneapolis, Minn.

[21] Appl. No.: 366,818

[22] Filed: Jun. 14, 1989

[51] Int. Cl.⁵ .............................................. H03H 11/24
[52] U.S. Cl. ..................................... 333/81 R; 333/23
[58] Field of Search ...................... 333/23, 81 R, 81 A

[56] References Cited

U.S. PATENT DOCUMENTS

| | | | |
|---|---|---|---|
| 1,018,874 | 2/1912 | Campos | 333/23 |
| 1,601,037 | 9/1926 | Nuquist | 333/23 X |
| 1,975,709 | 10/1934 | Blumlein | 333/81 R |
| 2,459,857 | 1/1949 | Watts, Jr. | 333/81 A X |
| 3,320,571 | 5/1967 | Webster | 333/23 X |
| 4,594,557 | 6/1986 | Shillady | 333/23 X |

Primary Examiner—Paul Gensler
Attorney, Agent, or Firm—Seymour Levine; Albin Medved; Roger W. Jensen

[57] ABSTRACT

A variable attenuator includes a plurality of circuit cells, each containing a variable resistance shunt element, cascaded to form an artificial transmission line with distributed loss represented by the variable resistance shunt element. Parameters of the transmission line are chosen in a manner to establish a characteristic impedance that is substantially independent of the shunt resistance value and to provide low insertion reflection coefficients for all attenuation values.

9 Claims, 3 Drawing Sheets

MATCHED MICROWAVE VARIABLE ATTENUATOR

BACKGROUND OF THE INVENTION

1. Field of the Invention

The invention pertains to the field of microwave attenuators and more particularly to matched microwave variable attenuators in monolithic microwave integrated circuits.

2. Description of the Prior Art

Microwave attenuators of the prior art have one of two classic configurations; the resistive Pi circuit shown in FIG. 1a and the resistive T circuit shown in FIG. 1b. These attenuators utilize either PIN diodes or field effect transistors (FETs) for the resistors $R_1$ and $R_2$. PIN diodes and FETs exhibit resistive changes with properly applied DC voltages and thus are useful as variable resistors. In the configurations shown in FIGS. 1a and 1b the resistive values, for all levels of attenuation are chosen to provide an impedance that matches the impedance of a transmission line, or another microwave device, to suppress reflections in the system. To accomplish this, the ratio of $R_2$ to $R_1$ must change with attenuation changes, establishing a functional relationship of $R_2/R_1$, versus attenuation which is extremely non-linear. This presents a very difficult tracking problem, requiring that the dc characteristics of the PIN diodes or FETs utilized in the attenuators be matched over the entire attenuation range. As a result, the PIN diodes and FETs are generally controlled with separate power supplies. Though control circuitry can be provided to supply the DC voltages to the voltage controlled resistances in their proper functional relationship from a single power supply, such circuitry requires much more real estate than the attenuator it controls and is therefore rejected for most applications.

The problem of providing the proper ratios for R1 and R2 to maintain a constant characteristic impedance for the Pi and T circuits of FIGS. 1a and 1b is exacerbated by the non-uniformity of the PIN diode and the FET characteristics that result with present day manufacturing processes. For example, the equivalent resistance value of a FET is a function of the pinch-off voltage, that voltage which must be exceeded by the gate voltage for current to flow in the FET. Present day manufacturing processes, however, yield FETs with pinch-off voltages that vary substantially. Since the resistance of the FET is a function of the pinch-off voltage, FETs exhibit resistance values having varying functional relationships of the gate voltage. Thus, for each attenuator a process is encountered for selecting three FETs with equal resistance versus gate voltage characteristics, greatly increasing cost of the attenuators.

Further, the resistive Pi and T circuits of FIGS. 1a and 1b cannot simultaneously realize low (off) state insertion loss and a large dynamic attenuation range with the variable resistors presently available. For both circuits a low insertion loss requires a low resistance value for the series elements and a high resistance value for the shunt elements. As attenuation increases from the minimum value the series resistance increases, while the shunt resistance decreases. Since the shunt resistance start at opposite ends of the functionality curve it is extremely difficult to provide the ratio of series resistance to shunt resistance required for the attenuation values desired and simultaneously maintain a constant characteristic impedance for the circuits.

Additionally, at high frequencies, the internal capacitances of the PIN diodes and FETs establish complex characteristics for the Pi and T circuits. To provide real characteristic impedances it is necessary to resonate out these capacitances by shunting inductors across the elements of the Pi and T circuits. These resonant circuits severely limit the operating bandwidth of the attenuator.

It is therefore desirable to supply an attenuator that provides a variable attenuation with the adjustment of a single resistor and exhibits a characteristic impedance that is not a function of this resistive value.

SUMMARY OF THE INVENTION

In accordance with the present invention a variable microwave attenuator includes a plurality of ladder circuits each having a series inductance and a shunt circuit comprising a capacitor and a variable resistor in parallel. The cells are cascaded in a manner to establish an artificial transmission line with distributed loss, represented by the variable resistor shunt elements. The variable resistor shunt elements may be realized with utilization of FETs which exhibit resistive changes with changes of voltage applied to their gates. The series inductance, shunt capacitance, and shunt variable resistors are chosen to establish an impedance for the artificial line that is substantially independent of the shunt resistance value and to provide a low reflection coefficient with its concomitant low voltage standing wave ratio (VSWR).

When cascaded, the internal ladder sections combine to form lossless symmetrical Pi cells with a variable resistor positioned between each cell. Symmetry of the artificial line may be completed with the addition of a shunt capacitor at one end of the artificial line to establish lossless symmetrical Pi end sections at the ends of the transmission line that are identical to the internal lossless symmetrical Pi sections formed by the cascading of the ladder networks.

DESCRIPTION OF THE PREFERRED EMBODIMENTS

Figure 1A:
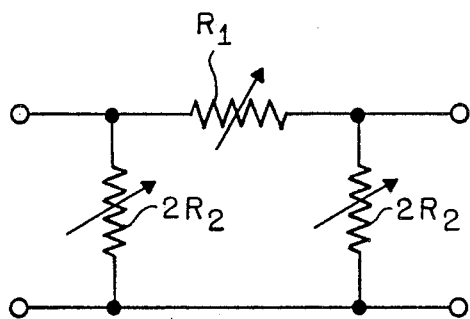
FIGS. 1a and 1b are circuit diagrams of variable microwave attenuators of the prior art.
Figure 1B:
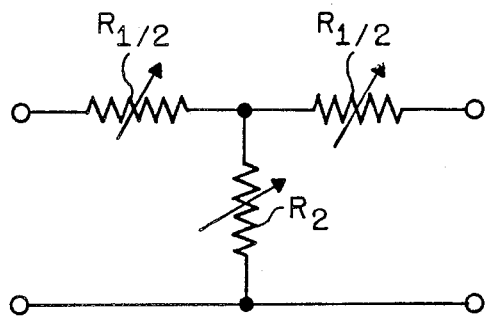
Figure 2:
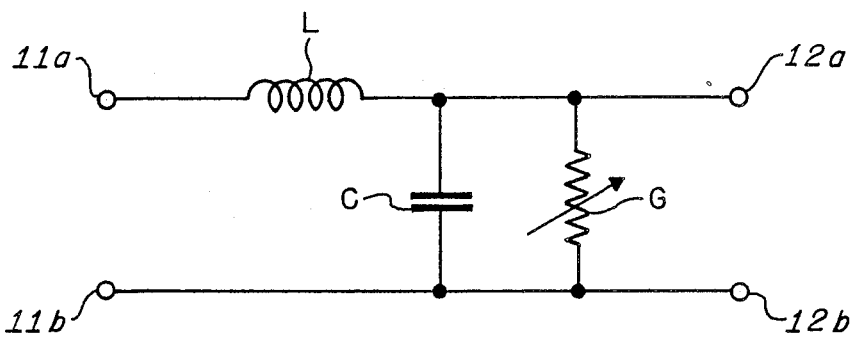
FIG. 2 is a schematic diagram of a lossy ladder cell utilized in the invention.

A loss circuit which may be utilized for a cell of a lossy transmission line is shown in FIG. 2. This ladder section comprises a series inductance L, a shunt capacitance C, and a shunt conductance G ($G=1/R$). Asymmetrical circuits of this type exhibit pair 11a, 11b, and the second looking into the terminal pair 12a, 12b. These characteristic impedances are given by equations (1a) and (1b)

$$Z_{01} = \qquad \qquad \qquad \qquad \text{1(a)}$$

$$jwL/2 + \sqrt{jwL(G - jwC)/[G^2 + (wC)^2] - (wL)^2}$$

$$Z_{02} = \qquad \qquad \qquad \qquad \text{1(b)}$$

$$-jwL/2 + \sqrt{jwL(G - jwC)/[G^2 + (wC)^2] - (wL)^2}$$

where $Z_{o1}$ and $Z_{o2}$ are the characteristic impedances looking into the terminal pair 11a, 11b, and 12a, 12b, respectively. If wC is sufficiently greater than G the quantity under the square root in equations (1a) and (1b) may be represented by $L/C-(wL)^2/4$. With this approximation the equations (1a) and (1b) may be approximated as shown in equation (1c). Further, if L/C is sufficiently greater than $(wL/2)^2$ the square root will be real. This condition requires that the magnitude of the capacitive shunt impedance $1/(wC)$ be sufficiently greater than the magnitude of the inductance series impedance (wL)/4. When the two criteria, mathematically represented in equation (1d), are met, the two characteristic impedances may then be represented as shown in equation (1e). Now, if L/C is sufficiently greater than $(wL/2)^2$ the characteristic impedance looking into the network from either terminal pair are equal and real and may be represented as shown in equation (1f).

$$Z_{01} = +jwL/2 + \sqrt{L/C - (wL/2)^2} \qquad \text{(1c)}$$

$$Z_{02} = -jwL/2 + \sqrt{L/C - (wL/2)^2}$$

$$G < wC < 4/wL \qquad \text{(1d)}$$

$$Z_{01} = +jwL + \sqrt{L/C} \qquad \text{(1e)}$$

$$Z_{02} = -jwL + \sqrt{L/C}$$

$$Z_{01} = Z_{02} = \sqrt{LC} = Z_0 \qquad \text{(1f)}$$

Figure 3A:
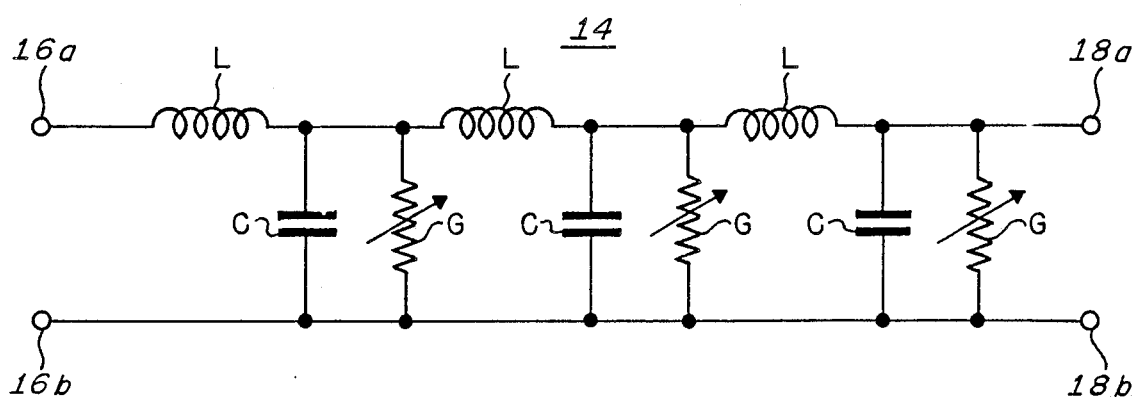
FIG. 3a is a schematic diagram of a plurality of ladder sections cascaded to form an artificial transmission line.
Figure 3B:
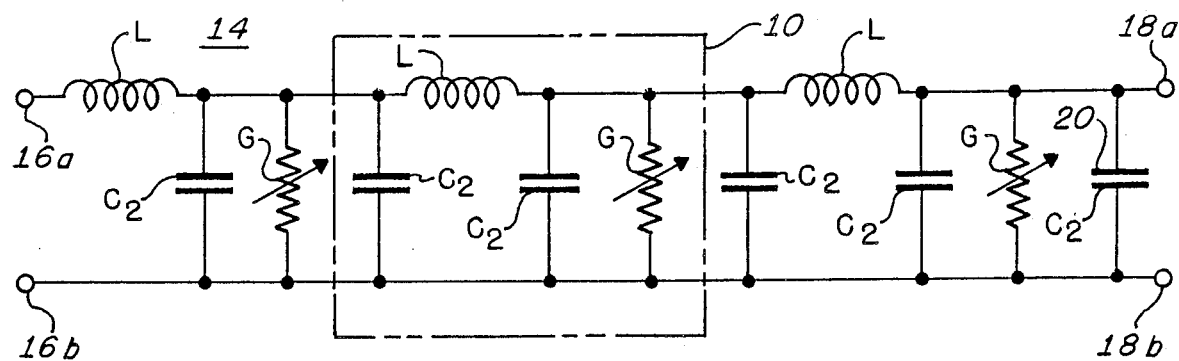
FIG. 3b is a circuit diagram of an artificial transmission line formed by cascading lossy ladder cells and indicating internal symmetrical Pi cells.

Cascading the unit cell shown in FIG. 2 provides an artificial transmission line 14 as shown in FIG. 3a. It should be apparent that the internal circuitry of this transmission line may be represented as lossless symmetrical Pi cells 16 with shunt conductances G positioned between each cell, as shown in FIG. 3b. The characteristic impedance of these symmetrical Pi cells, when wC is less than 4/(wL), is given by equation (1b). Shunt conductances positioned across a transmission line, that is otherwise matched, provide an insertion loss in dB that is given by equation (2)

$$IL_{db} = 10 \log[1 + GZ_0\frac{1}{4}(GZ_o)^2]$$

where $Z_o$ is the characteristic impedance of the transmission line prior to the insertion of the conductance G. Thus, with the proper choice of series inductance shunt capacitance, shunt conductance, and the number of cells required to provide the total attenuation desired, a variable attenuator that simulates a transmission line with variable loss may be provided.

Refer again to FIG. 3b. The transmission characteristics of the artificial line 14 may be determined from the transmission matrix for the line, known in the art as the ABCD matrix. This transmission matrix for the artificial transmission line of n cells is derived by raising the transmission matrix for a unit cell the nth power. The ABCD matrix for a cell, designated by M, is given by equation (4)

$$\begin{bmatrix} v_1 \\ i_1 \end{bmatrix} = \begin{bmatrix} A & B \\ C & D \end{bmatrix} \begin{bmatrix} v_2 \\ i_2 \end{bmatrix} \qquad \text{(3)}$$

$$M = \begin{bmatrix} 1 + ZYZ \\ Y \quad 1 \end{bmatrix} \qquad \text{(4)}$$

In this matrix the reactance of the series inductance is given by jwL and the susceptance of the capacitor C in parallel with the conductance G is given by $Y=jwC+G$ as shown in equation (4a)

$$Z = jwL, \quad Y = jwC + G$$

$$\cosh\theta = 1 + ZY/2, \quad \sinh\theta = \sqrt{ZY + (ZY/2)^2} \qquad \text{(4b)}$$

The characteristic values of the matrix M, obtained by well known matrix methods, are the propagation factors for each cell. There are two such factors; one for wave propagation to the right and the other for wave propagation to the left. These propagation factors are given by $\exp(\pm\Theta)$, where $\Theta$ is defined by the hyperbolic sine and cosine as indicated in the equation (4b). The transmission matrix of the artificial transmission line 14 is then the matrix M of equation (4) raised to the nth power and is given by equation (5)

$$M^n =$$

$$\begin{bmatrix} \frac{ZY \sinh(n\theta)}{2\sinh\theta} + \cosh(n\theta) & \frac{Z \sinh(n\theta)}{\sinh\theta} \\ \frac{Y \sinh(n\theta)}{\sinh\theta} & \frac{-ZY \sinh(n\theta)}{2\sinh\theta} + \cosh(n\theta) \end{bmatrix}$$

which not only provides transmission characteristics of the artificial transmission line but may also be utilized to determine the insertion reflection coefficient when the artificial transmission line is inserted in a transmission line having the characteristic impedance equal to that of the lossless cell 16.

When the impedances and admittances in equations (4) and (5) are normalized to the characteristic impedance and admittance of the transmission line, equation (5) may be utilized to determine the reflection coefficient at the terminal pair 16a, 16b. Under these conditions the voltages and currents are normalized and may be utilized to determine the incident and reflected voltages at the terminal pair 16a, 16b when the artificial transmission line 14 is terminated by a reflectionless load relative to the normalizing parameters. Those skilled in the art should recognize that the incident voltage a and the reflected voltage b are given by the sum and difference of voltage and current, respectively, at the terminal pair as shown in the equation (6a). The ratio of the reflected voltage b to the incident voltage a is the reflection coefficient as given in equation (6b).

$$a = v_1 + i_1 \quad (6a)$$

$$b = v_1 - i_1$$

$$\Gamma = b/a = \frac{(A + B) - (C + D)}{A + B + C + D} \quad (6b)$$

Substituting the values for A, B, C, and D as determined from equation (5) into equation (6b) yields a reflection coefficient $\Gamma$ given in equation (7).

$$\Gamma = \frac{ZY + Z - Y}{Z + Y + 2\coth(n\theta)\sinh\theta} \quad (7)$$

$$V_P = \sqrt{Z_0 P} \quad (8)$$

$$I_m = \frac{V_P}{R_m} \quad (9)$$

$$I_m = \sqrt{\frac{2P}{Z_0}} \quad (10)$$

It should be remembered that $\Theta$ is the propagation constant for one cell in the artificial transmission line and that $n\Theta$ is the propagation constant of the entire lossy transmission line of n cells.

Figure 4:
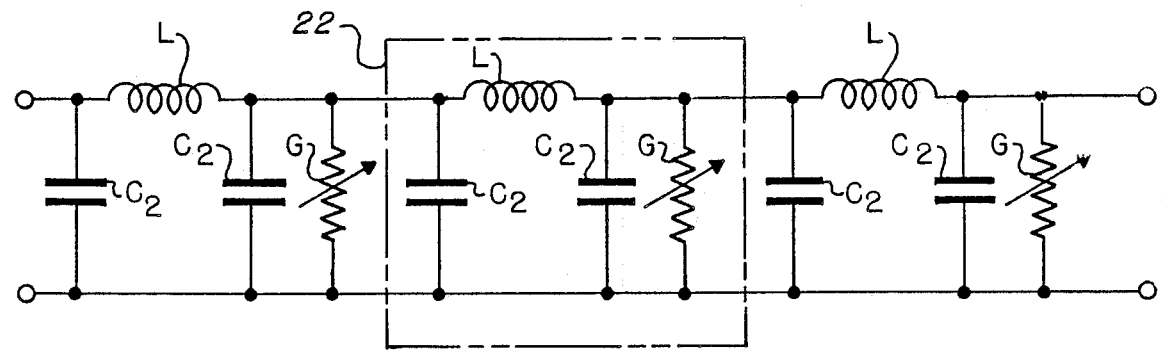
FIG. 4 is a circuit diagram of an artificial transmission line with symmetrical Pi cells on each end.

Referring again to FIG. 3b, to provide better symmetry for the artificial transmission line, the capacitor 20 across the terminal pair 18a, 18b may be removed therefrom and shunted across the input terminal pair 16a, 16b. This interchange of a capacitor of value C/2 establishes the artificial transmission line shown in FIG. 4. This transmission line is formed by cascading a lossless symmetrical Pi circuit shunted at one end by a variable conductance G to form the asymmetrical Pi cell 22. The attenuation provided and the reflection coefficient of the artificial transmission line of FIG. 4 may be determined as previously described.

Figure 5:
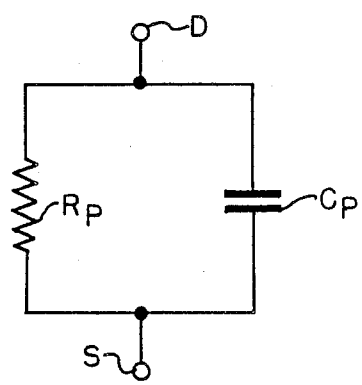
FIG. 5 is an equivalent circuit for a FET.

A critical component of the lossy transmission line is the variable conductance G. This variable conductance may be provided by a PIN diode, FET, or any other voltage variable resistance. A FET, because of the ease with which its resistance may be varied, is generally preferred. An equivalent circuit of a FET may be a parallel combination of a capacitor Cp and a resistor Rp coupled between the source and drain terminals as shown in FIG. 5. Varying the voltage between the gate and the source varies the value of the resistance Rp, thereby providing variable attenuation for the artificial transmission line. The voltage Vgs, however, also effects capacitance Cp. Since the characteristic impedance of the artificial transmission line is a function of the shunt capacitors, this variation in capacitance with gate voltage may vary the characteristic impedance and adversely affect the reflection coefficient of the line. Such capacitive variation may be minimized by shunting the FET with a capacitor having a value sufficiently large to render the capacitor variations with gate voltage of the FET negligible. Incorporating the FET's (or PIN diode's) capacitance into the circuit in this manner and the judicious choice of L and the total C according to equation (1d) provides a significant improvement in the attenuators useable bandwidth.

Physical limitations of the FET such as power dissipation, saturated drain-to-source current, and the breakdown voltages of the drain-gate and gate-source junctions must be considered, for these impact the maximum allowable input power and the choice of the characteristic impedance.

Since the attenuation provided is equal for each cell, the power along the artificial transmission line decreases exponentially. Thus the first cell dissipate more power than succeeding cells. When the attenuator if "off", i.e. no attenuation is provided by the artificial transmission line, the voltage Vp across all the FETs is given by equation (8) where P is the input power. This voltage divides between the drain-gate and gate-source junctions in accordance with capacitive values between the drain and gate and gate and source. Consequently, the characteristic impedance of the artificial transmission line and the maximum power coupled thereto must be chosen such that the peak voltage between the gate and source and the peak voltage between the gate and drain do not exceed the breakdown values of the junctions.

When the attenuator provides maximum attenuation a maximum current flows through the FETs, the current of largest magnitude Im flows through the FET in the first cell which is given by equation (9), where Rm is the minimum resistance of the FET. The attenuator design must be such that the maximum current Im does not exceed the maximum drain current specified for the FET.

One further consideration must be given in the design of an artificial transmission line attenuator. The maximum current Im that flows through series inductors of the artificial transmission line is given by (10). Consequently, these inductors must be capable of handling currents of such amplitude.

Figure 6:
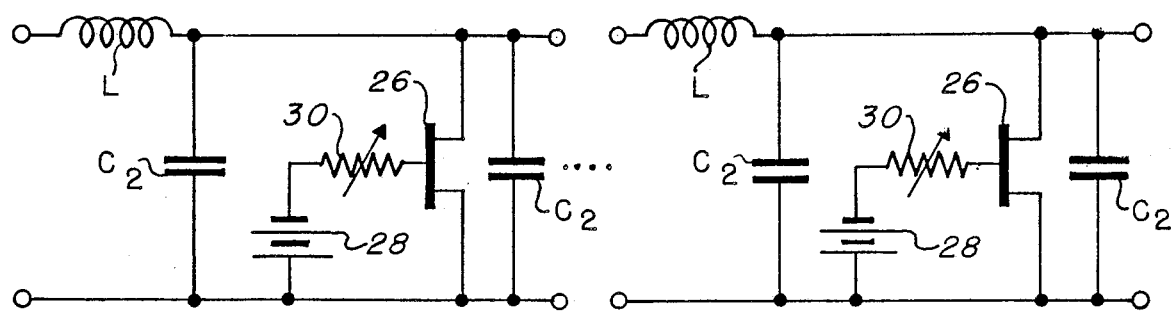
FIG. 6 is a schematic representation of a symmetrical artificial transmission line indicating the use of FETs therein as a variable resistor.

In FIG. 6 the artificial transmission line 14 of FIG. 3a is shown with the variable shunt resistor replaced by a FET 26 coupled to a voltage source 28 via a potentiometer 30 for varying the gate voltage. Though the figure indicates that the gate terminals are coupled to a separate power sources and potentiometers, it should be apparent that a single source and potentiometer may be employed for varying the gate voltages of the FETs. It should also be apparent that differences between the constituent FETs' resistance versus gate voltage characteristics do not affect the characteristic impedance of the circuit.

Figure 7:
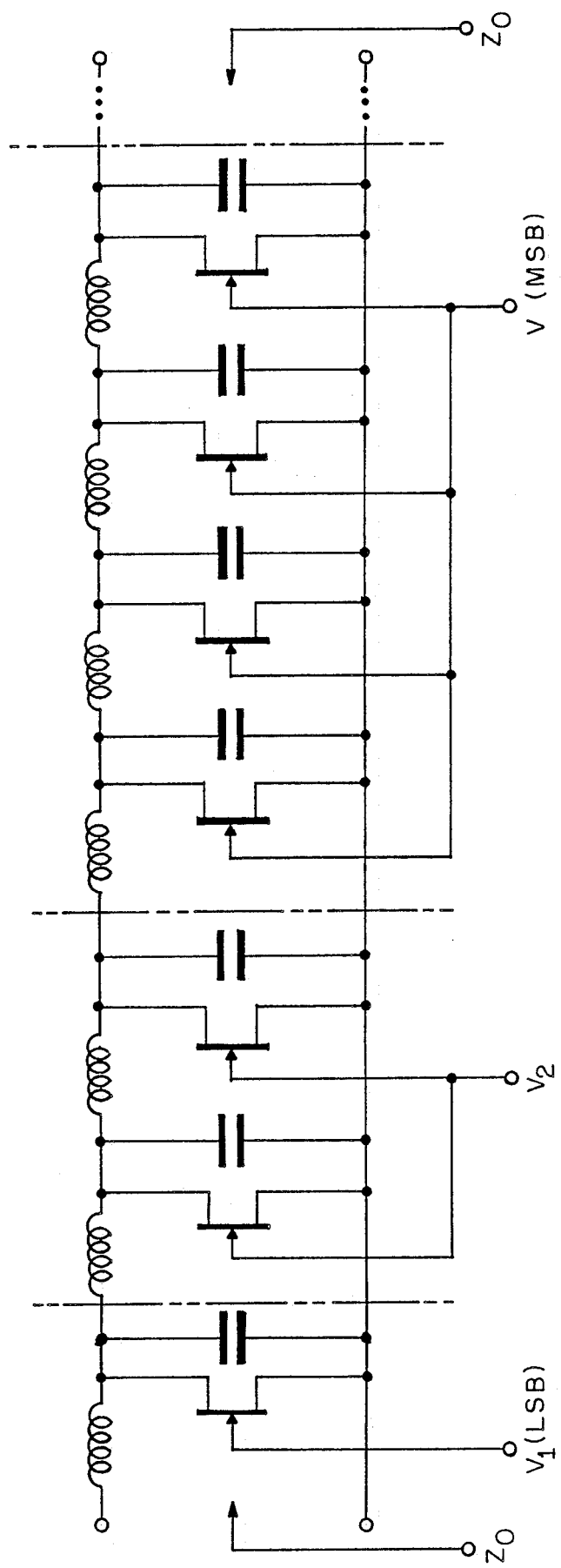
FIG. 7 is a schematic diagram of a plurality of ladder sections cascaded to form an artificial transmission line wherein the variable shunt conductances are digitally controlled.

Though the invention has been described with reference to analog control of the variable resistors, it should be apparent digital control may also be employed. This may be accomplished by dividing the circuit into n sections, each section having $2^k$ cells (k=0, 1, ..., n−1), thereby realizing an n bit digital attenuator, as shown in FIG. 7, wherein $V_1$ is the least significant bit (LSB) and $V_2$ is the most significant bit (MSB) of the digital signal controlling the artificial transmission line attenuator.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. A variable attenuator comprising at least one circuit cell constructed and arranged to establish an artificial transmission line, each circuit cell of said at least one circuit cell having a variable shunt conductance element such that attenuation variable with settings of said variable shunt conductance is provided by power dissipation in said variable shunt conductance element in each of said at least one circuit cell.

2. An attenuator in accordance with claim 1 wherein each circuit cell of said at least one circuit cell is a ladder circuit having a series inductance and a shunt capacitance.

3. An attenuator in accordance with claim 2 wherein said variable shunt conductance element is an electrically variable resistor coupled in parallel with said shunt capacitance.

4. An attenuator in accordance with claim 3 wherein said electrically variable resistor is a FET.

5. An attenuator in accordance with claim 3 wherein said electrically variable resistor is a PIN diode.

6. An attenuator in accordance with claim 1 wherein each of said at least one circuit cell is a Pi circuit having first and second shunt capacitors and a series inductor coupled between said first and second shunt capacitors.

7. An attenuator in accordance with claim 6 wherein said variable shunt conductance element is an electrically variable resistor coupled in parallel with one of said first and second shunt capacitors.

8. An attenuator in accordance with claim 7 wherein said electrically variable resistor is a FET.

9. An attenuator in accordance with claim 7 wherein said electrically variable resistor is a PIN diode.

* * * * *